(12) United States Patent
Song

(10) Patent No.: US 9,349,846 B1
(45) Date of Patent: May 24, 2016

(54) LATERAL BIPOLAR JUNCTION TRANSISTORS HAVING HIGH CURRENT-DRIVING CAPABILITY

(71) Applicant: SK hynix Inc., Gyeonggi-do (KR)

(72) Inventor: Hyun Min Song, Sejong (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/696,111

(22) Filed: Apr. 24, 2015

(30) Foreign Application Priority Data

Nov. 7, 2014 (KR) .................. 10-2014-0154785

(51) Int. Cl.
*H01L 27/102* (2006.01)
*H01L 29/735* (2006.01)
*H01L 29/06* (2006.01)

(52) U.S. Cl.
CPC .......... *H01L 29/735* (2013.01); *H01L 29/0696* (2013.01)

(58) Field of Classification Search
CPC .................. H01L 29/735; H01L 29/0696
USPC ...................................................... 257/579
See application file for complete search history.

(56) References Cited

U.S. PATENT DOCUMENTS

| 7,701,038 | B2* | 4/2010 | Chen .................. H01L 29/735 257/197 |
| 8,143,644 | B2* | 3/2012 | Chung ................ H01L 27/0207 257/133 |
| 8,415,764 | B2* | 4/2013 | Chung ................ H01L 27/0823 257/565 |
| 9,099,517 | B2* | 8/2015 | Konstantinov .... H01L 29/66068 |
| 2014/0159207 | A1* | 6/2014 | Domanski ............... H01L 29/73 257/565 |

FOREIGN PATENT DOCUMENTS

KR        1019970018353        4/1997

\* cited by examiner

*Primary Examiner* — Luan C Thai
(74) *Attorney, Agent, or Firm* — IP & T Group LLP

(57) ABSTRACT

A bipolar junction transistor includes a common base region, a plurality of emitter regions disposed in the common base region and arrayed to be spaced apart from each other in a first diagonal direction, and a plurality of collector regions disposed in the common base region and arrayed to be spaced apart from each other in the first diagonal direction. The plurality of emitter regions and the plurality of collector regions are alternately arrayed in a second diagonal direction.

19 Claims, 10 Drawing Sheets

LATERAL BIPOLAR JUNCTION TRANSISTORS HAVING HIGH CURRENT-DRIVING CAPABILITY

CROSS-REFERENCE TO RELATED APPLICATION

The present application claims priority under 35 U.S.C 119(a) to Korean Application No. 10-2014-0154785, filed on Nov. 7, 2014, in the Korean Intellectual Property Office, which is incorporated herein by reference in its entirety.

BACKGROUND

1. Technical Field

Various embodiments of the present disclosure relate to bipolar junction transistors, and more particularly, to lateral bipolar junction transistors having high current-driving capability.

2. Related Art

Bipolar junction transistors are used in various circuits such as signal amplification circuits and reference voltage generation circuits. In general, bipolar junction transistors are fabricated using pure bipolar process technologies. However, in some cases, bipolar junction transistors are fabricated with complementary metal-oxide-semiconductor (CMOS) circuits or double diffused metal-oxide-semiconductor (DMOS) circuits using CMOS compatible process technologies, bipolar-CMOS (BiCMOS) process technologies, or the like. Thus, bipolar junction transistors have been employed in various electronic systems. For example, office automation equipment, home appliances, or other electronic products. Bipolar junction transistors fabricated by the CMOS compatible process technologies are referred to as lateral bipolar junction transistors, and it is well known that lateral bipolar junction transistors have a high threshold frequency (Ft) and high current gain ($\beta$).

SUMMARY

Various embodiments are directed to lateral bipolar junction transistors having high current-driving capability.

According to an embodiment, a lateral bipolar junction transistor includes a common base region, a plurality of emitter regions disposed in the common base region and arrayed to be spaced apart from each other in a first diagonal direction, and a plurality of collector regions disposed in the common base region and arrayed to be spaced apart from each other in the first diagonal direction, wherein the plurality of emitter regions and the plurality of collector regions are alternately arrayed in a second diagonal direction.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

It will be understood that although the terms such as "first", "second", "third" etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may be directly in contact with the other element, or at least one intervening element may be present therebetween. Accordingly, the terms such as "on", "over", "above", "under", "beneath", "below" and the like that are used herein are for describing particular embodiments only and are not intended to limit the scope of the present disclosure.

It will be further understood that when an element is referred to as being "connected" or "coupled" to another element, it can be directly connected or coupled to the other element or intervening elements may be present.

Figure 1:
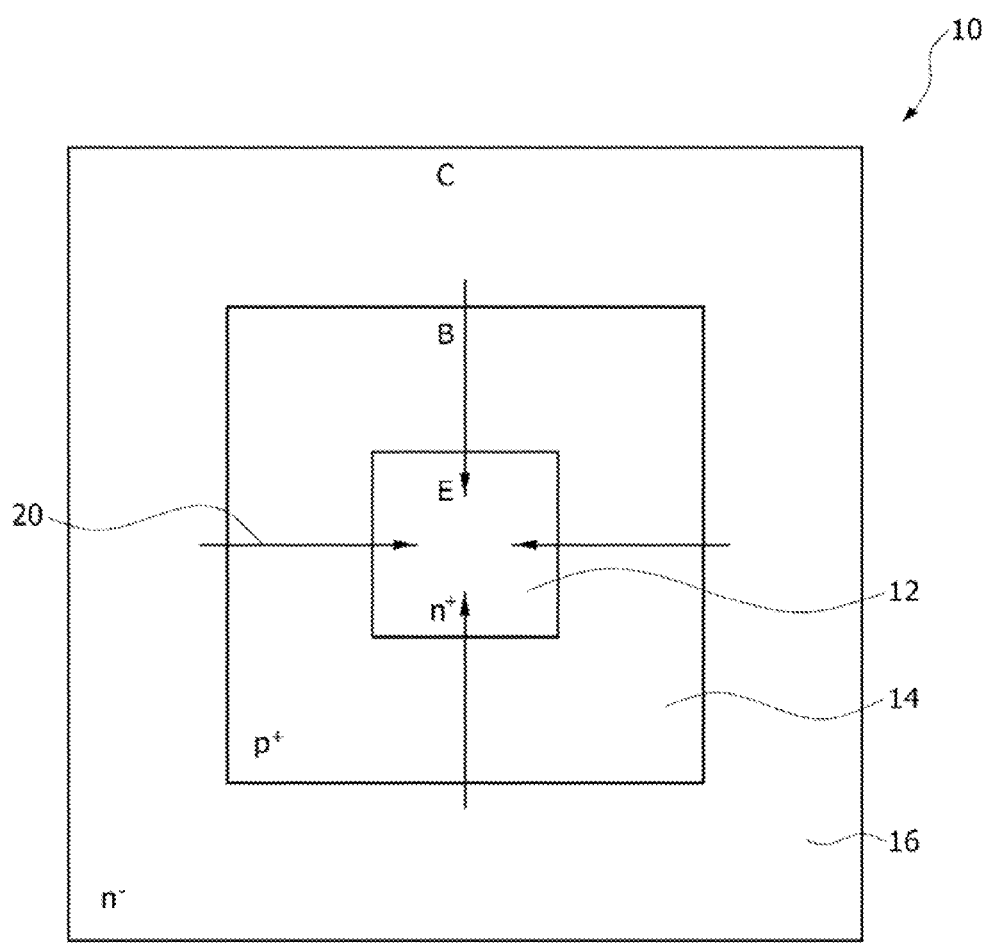
FIG. 1 is a plan view illustrating a lateral NPN bipolar junction transistor which is generally employed in semiconductor devices.

FIG. 1 is a plan view illustrating a lateral NPN bipolar junction transistor 10 which is generally employed in semiconductor devices. Referring to FIG. 1, the lateral NPN bipolar junction transistor 10 may include a plurality of doped regions, for example, an emitter region (E) 12, a base region (B) 14, and a collector region (C) 16. The emitter region (E) 12 may be surrounded by the base region (B) 14, and the base region (B) 14 may be surrounded by the collector region (C) 16. The emitter region (E) 12 may be heavily doped with N-type impurities, and the collector region (C) 16 may be lightly doped with N-type impurities. The base region (B) 14 may be doped with P-type impurities. In the lateral NPN bipolar junction transistor 10, if a forward bias is applied between the emitter region (E) 12 and the base region (B) 14 and a reverse bias is applied between the base region (B) 14 and the collector region (C) 16, collector current may flow from the collector region (C) 16 toward the emitter region (E) 12 as indicated by arrows 20. In such case, the amount of the collector current may be influenced by the junction area between the emitter region (E) 12 and the base region (B) 14. That is, if the junction area between the emitter region (E) 12 and the base region (B) 14 increases to improve the current-driving capability of the lateral NPN bipolar Junction transistor 10, the planar area that the lateral NPN bipolar junction transistor 10 occupies may also increase.

Figure 2:
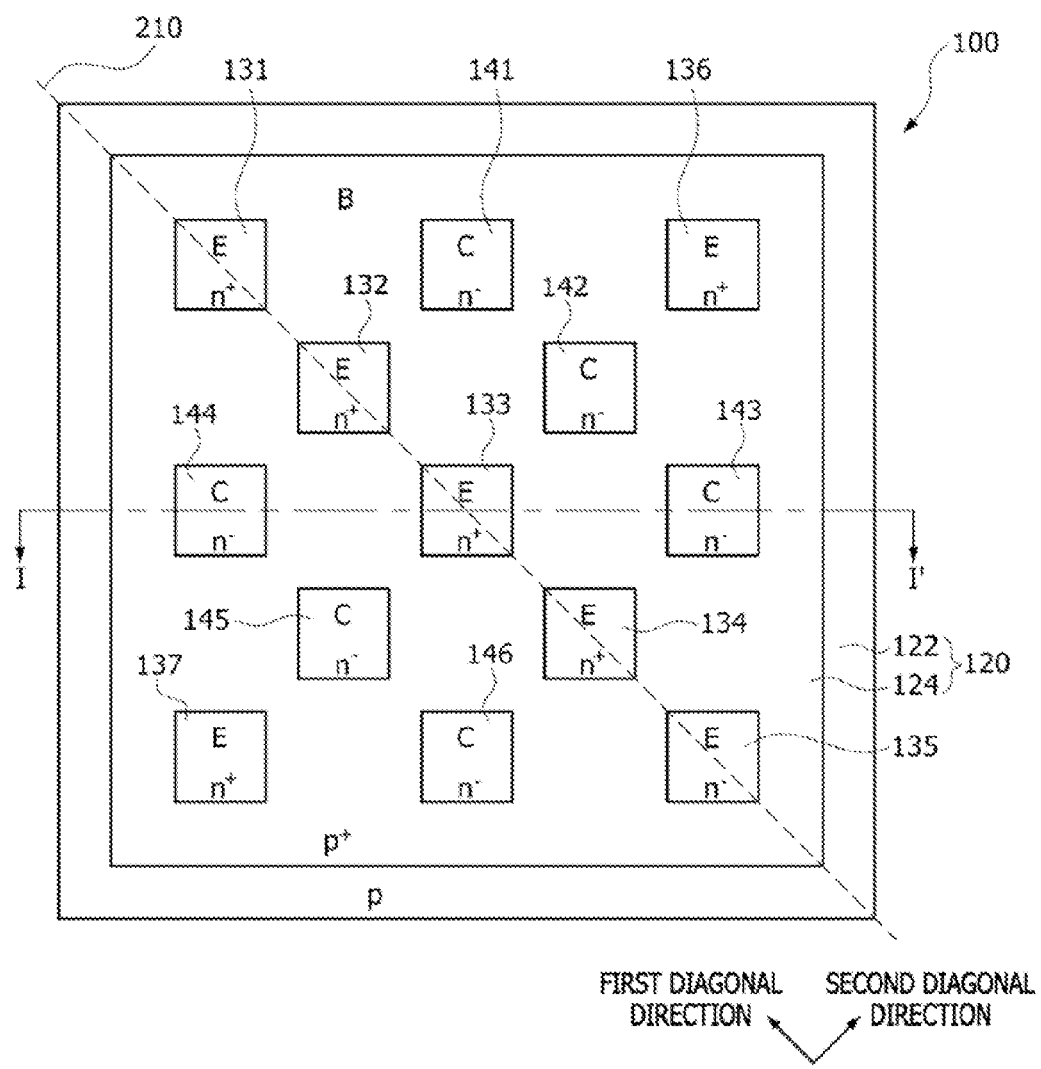
FIG. 2 is a plan view illustrating a lateral bipolar junction transistor according to an embodiment.

FIG. 2 is a plan view illustrating a lateral bipolar junction transistor 100 according to an embodiment. Referring to FIG. 2, the lateral bipolar junction transistor 100 may correspond to a lateral NPN bipolar junction transistor and may include a common base region 120, a plurality of island-shaped emitter regions 131~137 disposed in the common base region 120, and a plurality of island-shaped collector regions 141~146 disposed in the common base region 120. The common base region 120 may include a low concentration base region 122 and a high concentration base region 124. The low concentration base region 122 may be lightly doped with P-type impurities, and the high concentration base region 124 may be heavily doped with P-type impurities. The low concentration base region 122 may be disposed to surround sidewalls and a bottom surface of the high concentration base region 124. In some embodiments, the low concentration base region 122 may have a rectangular shape in a plan view. Similarly, the high concentration base region 124 may also have a rectangular shape in a plan view.

The plurality of island-shaped emitter regions 131~137 may be N-type, and the plurality of island-shaped collector regions 141~146 may also be N-type. An impurity concentration of the emitter regions 131~137 may be higher than an impurity concentration of the collector regions 141~146. The emitter regions 131~137 may include first emitter regions 131~135, a second emitter region 136, and a third emitter region 137. The first emitter regions 131~135 may be arrayed on a diagonal line 210, which extends from an upper-left corner of the high concentration base region 124 toward a lower-right corner of the high concentration base region 124 in a first diagonal direction, to be spaced apart from each other. The second emitter region 136 may be disposed in an upper-right corner of the high concentration base region 124, and the third emitter region 137 may be disposed in a lower-left corner of the high concentration base region 124. The collector regions 141~146 may include first collector regions 141~143 and second collector regions 144~146. The first collector regions 141~143 may be disposed between the diagonal line 210 and the second emitter region 136 and may be arrayed in the first diagonal direction to be spaced apart from each other. The second collector regions 144~146 may be disposed between the diagonal line 210 and the third emitter region 137 and may be arrayed in the first diagonal direction to be spaced apart from each other. According to the array of the emitter regions and the collector regions described above, the emitter regions and the collector regions may be alternately arrayed in a second diagonal direction perpendicular to the first diagonal direction.

Figure 3:
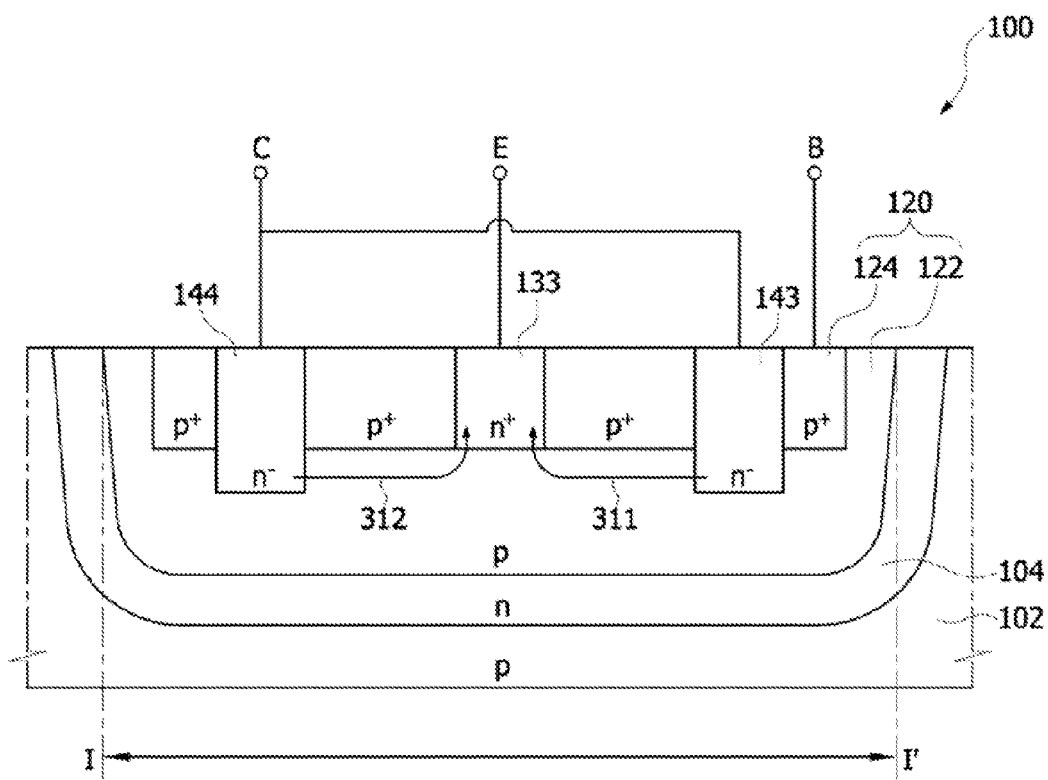
FIG. 3 is a cross-sectional view of the lateral bipolar junction transistor shown in FIG. 2 according to an embodiment, which is taken along a line I-I' of FIG. 2.

FIG. 3 is a cross-sectional view of the lateral bipolar junction transistor 100 shown in FIG. 2 according to an embodiment, which is taken along a line I-I' of FIG. 2. Referring to FIGS. 2 and 3, an N-type deep well region 104 may be disposed in an upper region of a P-type substrate 102. The low concentration base region 122 of the common base region 120 may be disposed in an upper region of the deep well region 104. The emitter regions 131~137 and the collector regions 141~146 may be disposed in an upper region of the low concentration base region 122 to be spaced apart from each other. The high concentration base region 124 may be disposed between sidewalls of the emitter regions 131~137 and the collector regions 141~146.

The first emitter region 133 and the high concentration base region 124 may have the same junction depth. Although not shown in FIG. 3, all of the emitter regions 131~137 illustrated in FIG. 2 may have substantially the same junction depth as the high concentration base region 124. The first collector region 143 and the second collector region 144 may have a junction depth, which is greater than a junction depth of the high concentration base region 124. All of the collector regions 141~146 illustrated in FIG. 2 may also have substantially the same junction depth. The first collector region 143 and the second collector region 144 may be lightly doped with N-type impurities, as described above. Thus, all of the collector regions 141~146 may be formed while N-type lightly doped drain (LDD) regions (i.e., N-type extensions) of NMOS transistors are formed in other regions of the substrate 102 adjacent to the lateral bipolar junction transistor 100. The first emitter region 133 and the high concentration base region 124 may be heavily doped with N-type impurities and P-type impurities, respectively. Thus, the first emitter region 133 (i.e., all of the emitter regions 131~137) may be formed while N-type source/drain regions of the NMOS transistors are formed in the other regions of the substrate 102 adjacent to the lateral bipolar junction transistor 100, and the high concentration base region 124 may be formed while P-type body contact regions (or P-type source/drain regions) of the NMOS transistors (or PMOS transistors) are formed in the other regions of the substrate 102 adjacent to the lateral bipolar junction transistor 100. Accordingly, if the N-type LDD regions (i.e., the N-type extensions) of the NMOS transistors are deeper than the N-type source/drain regions and the P-type body contact regions of the NMOS transistors, the first collector region 143 and the second collector region 144 may be deeper than the high concentration base region 124 and the first emitter region 133, as illustrated in FIG. 3.

The deep well region 104 may be disposed to electrically isolate the low concentration base region 122 from the substrate 102. For example, if a voltage applied to the deep well region 104 is higher than a voltage applied to the low concentration base region 122, a parasitic PN diode comprised of the deep well region 104 and the low concentration base region 122 may be reverse-biased to electrically insulate the low concentration base region 122 from the substrate 102. That is, the low concentration base region 122 may be electrically isolated from other devices disposed in the substrate 102 adjacent to the deep well region 104, and an electric potential of the substrate 102 may not fluctuate even though the lateral bipolar junction transistor 100 operates.

The first emitter region 133 may be electrically connected to an emitter terminal E. Although FIG. 3 illustrates a cross-sectional view in which only the first emitter region 133 is electrically connected to the emitter terminal E, all of the emitter regions 131~137 illustrated in FIG. 2 may be electrically connected to the emitter terminal E. The first and second collector regions 143 and 144 may be electrically connected to a collector terminal C. More specifically, all of the collector regions 141~146 illustrated in FIG. 2 may be electrically connected to the collector terminal C. The high concentration base region 124 may be electrically connected to a base terminal B. Because both of the low concentration base region 122 and the high concentration base region 124 are P-type, a bias voltage may be transmitted from the base terminal B to the low concentration base region 122 through the high concentration base region 124.

If a forward bias is applied between the emitter terminal E and the base terminal B and a reverse bias is applied between the collector terminal C and the base terminal B, the lateral bipolar junction transistor 100 may operate in an active mode. In the active mode of the lateral NPN bipolar junction transistor 100, electrons corresponding to dominant carriers (or majority carriers) of current may move from the emitter terminal E toward the collector terminal C. Accordingly, collector current may flow from the collector terminal C toward the emitter terminal E. Specifically, a portion of the collector current may flow from the first collector region 143 toward the first emitter region 133, as indicated by an arrow 311. Moreover, another portion of the collector current may flow from the second collector region 144 toward the first emitter region 133, as indicated by an arrow 312.

Figure 4:
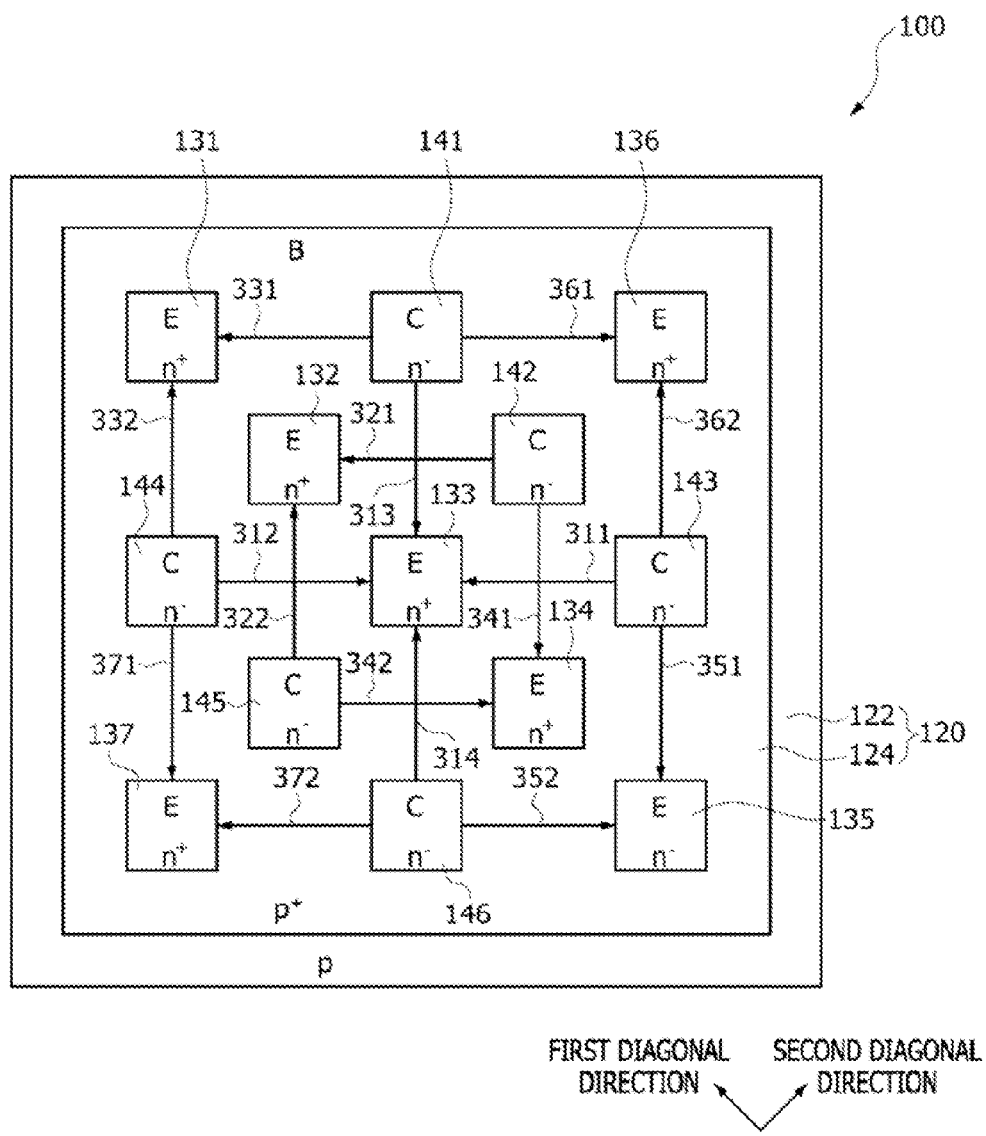
FIG. 4 is a plan view illustrating current paths between collector regions and emitter regions in an active mode of the lateral bipolar junction transistor shown in FIG. 2.

FIG. 4 is a plan view illustrating current paths between the collector regions and the emitter regions in an active mode of the lateral bipolar junction transistor 100 shown in FIG. 2. In FIG. 4, the same reference numerals as used in FIG. 2 denote the same elements. Thus, descriptions of the same elements as illustrated in FIG. 2 will be omitted or briefly mentioned in this embodiment.

Referring to FIG. 4, the first emitter region 133 disposed at a central region of the high concentration base region 124 may receive collector current from the first and second collector regions 143 and 144 through the current paths 311 and 312, as described with reference to FIG. 3. Similarly, the first emitter region 133 may receive collector current from the first collector region 141 disposed at an upper side of the first emitter region 133 through a current path 313 and may receive collector current from the second collector region 146 disposed at a lower side of the first emitter region 133 through a current path 314. Thus, the current paths 311, 312, 313 and 314 reaching the first emitter region 133 may respectively face four sidewalls of the first emitter region 133 when viewed from a plan view of FIG. 4.

The first emitter region 132 may receive collector current from the first collector region 142 through a current path 321 and may receive collector current from the second collector region 145 through a current path 322. Thus, the current paths 321 and 322 reaching the first emitter region 132 may respectively face a right sidewall and a lower sidewall of the first emitter region 132 when viewed from a plan view of FIG. 4. In addition, the first emitter region 131 may receive collector current from the first collector region 141 through a current path 331 and may receive collector current from the second collector region 144 through a current path 332. Thus, the current paths 331 and 332 reaching the first emitter region 131 may respectively face a right sidewall and a lower sidewall of the first emitter region 131 when viewed from a plan view of FIG. 4.

The first emitter region 134 may receive collector current from the first collector region 142 through a current path 341 and may receive collector current from the second collector region 145 through a current path 342. Thus, the current paths 341 and 342 reaching the first emitter region 134 may respectively face an upper sidewall and a left sidewall of the first emitter region 134 when viewed from a plan view of FIG. 4. In addition, the first emitter region 135 may receive collector current from the first collector region 143 through a current path 351 and may receive collector current from the second collector region 146 through a current path 352. Thus, the current paths 351 and 352 reaching the first emitter region 135 may respectively face an upper sidewall and a left sidewall of the first emitter region 135 when viewed from a plan view of FIG. 4.

The second emitter region 136 may receive collector current from the first collector region 141 through a current path 361 and may receive collector current from the first collector region 143 through a current path 362. Thus, the current paths 361 and 362 reaching the first emitter region 136 may respectively face a left sidewall and a lower sidewall of the second emitter region 136 when viewed from a plan view of FIG. 4. Similarly, the third emitter region 137 may receive collector current from the second collector region 144 through a current path 371 and may receive collector current from the second collector region 146 through a current path 372. Thus, the current paths 371 and 372 reaching the first emitter region 137 may respectively face an upper sidewall and a right sidewall of the third emitter region 137 when viewed from a plan view of FIG. 4.

As described above, the lateral bipolar junction transistor 100 may be configured to have sixteen current paths between the emitter terminal E (i.e., the emitter regions) and the collector terminal C (i.e., the collector regions). That is, the lateral bipolar junction transistor 100 may be designed to have sixteen current paths between the emitter terminal E (i.e., the emitter regions) and the collector terminal C (i.e., the collector regions), while the general bipolar junction transistor 10 shown in FIG. 1 has only four current paths 20 between the emitter terminal E (i.e., the emitter region 12) and the collector terminal C (i.e., the collector region 16), in the same planar area. In this case, each of emitter-base junction areas of the lateral bipolar junction transistor 100 may be less than an emitter-base junction area of the general bipolar junction transistor 10 shown in FIG. 1. However, the total number of the emitter-base junction regions of the lateral bipolar Junction transistor 100 may be seven times that of the general bipolar junction transistor 10 shown in FIG. 1. Thus, the current-driving capability of the lateral bipolar junction transistor 100 may be improved as compared with the general bipolar junction transistor 10 shown in FIG. 1.

Figure 5:
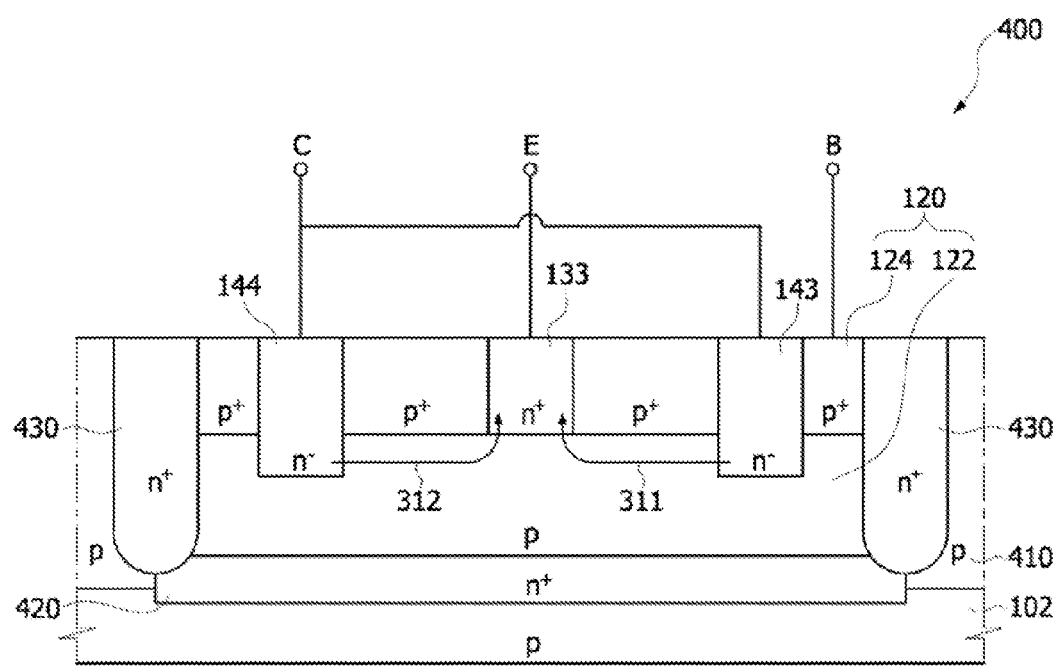
FIG. 5 is a cross-sectional view of a lateral bipolar junction transistor according to another embodiment.

FIG. 5 is a cross-sectional view of a lateral bipolar junction transistor 400 according to another embodiment. In FIG. 5, the same reference numerals as used in FIGS. 2 and 3 denote the same elements.

Referring to FIGS. 2 and 5, a P-type semiconductor layer 410 may be disposed in an upper region of a P-type substrate 102. The P-type semiconductor layer 410 may be formed using an epitaxial process. An N-type buried layer 420 may be disposed between the semiconductor layer 410 and the substrate 102. Impurities in the buried layer 420 may be activated and vertically diffused into the semiconductor layer 410 and the substrate 102 while the semiconductor layer 410 is formed. Edges of the buried layer 420 may be in contact with a lower end of an N-type sink region 430. The sink region 430 may upwardly extend to penetrate the semiconductor layer 410. Although not shown in FIG. 5, an N-type sink contact region may be disposed in an upper region of the sink region 430. The semiconductor layer 410 surrounded by the sink region 430 and the buried layer 420 may act as a low concentration base region 122. If a positive voltage over a certain level is applied to the sink region 430 and the buried layer 420 and the semiconductor layer 410 is grounded, the low concentration base region 122 may be electrically isolated from other devices disposed in the substrate 102 or the semiconductor layer 410 because of the presence of the sink region 430 and the buried layer 420, and an electric potential of the substrate 102 may not fluctuate even though the lateral bipolar junction transistor 400 fabricated in the low concentration base region 122 operates.

A first emitter region 133, a first collector region 143 and a second collector region 144 may be disposed in an upper region of the low concentration base region 122 to be spaced apart. A high concentration base region 124 may be disposed between sidewalls of the first emitter region 133 and the first and second collector regions 143 and 144. The first emitter region 133 and the high concentration base region 124 may have the same junction depth. Although not shown in FIG. 5, the lateral bipolar junction transistor 400 may include a plurality of emitter regions having substantially the same junction depth as the high concentration base region 124, as illustrated in FIGS. 2 and 3. The first collector region 143 and the second collector region 144 may have a junction depth which is greater than a junction depth of the high concentration base region 124. The lateral bipolar junction transistor 400 may include a plurality of collector regions having substantially the same junction depth as the first and second collector regions 143 and 144, as illustrated in FIGS. 2 and 3.

The first emitter region 133 may be electrically connected to an emitter terminal E. Although FIG. 5 illustrates a cross-sectional view in which only the first emitter region 133 is electrically connected to the emitter terminal E, all of the emitter regions may be electrically connected to the emitter terminal E. The first and second collector regions 143 and 144 may be electrically connected to a collector terminal C. More specifically, all of the collector regions may be electrically connected to the collector terminal C. The high concentration base region 124 may be electrically connected to a base terminal B. Because both of the low concentration base region 122 and the high concentration base region 124 are P-type, a bias voltage may be transmitted from the base terminal B even to the low concentration base region 122 through the high concentration base region 124.

If a forward bias is applied between the emitter terminal E and the base terminal B and a reverse bias is applied between the collector terminal C and the base terminal B, the lateral bipolar junction transistor 400 may operate in an active mode. In the active mode of the lateral NPN bipolar junction transistor 400, electrons corresponding to dominant carriers (or majority carriers) of current may move from the emitter terminal E toward the collector terminal C. Accordingly, collector current may flow from the collector terminal C toward the emitter terminal E. Specifically, a portion of the collector current may flow from the first collector region 143 toward the first emitter region 133, as indicated by an arrow 311. Moreover, another portion of the collector current may flow from the second collector region 144 toward the first emitter region 133, as indicated by an arrow 312. The lateral NPN bipolar junction transistor 400 may exhibit the same current paths as described with reference to FIG. 4.

Figure 6:
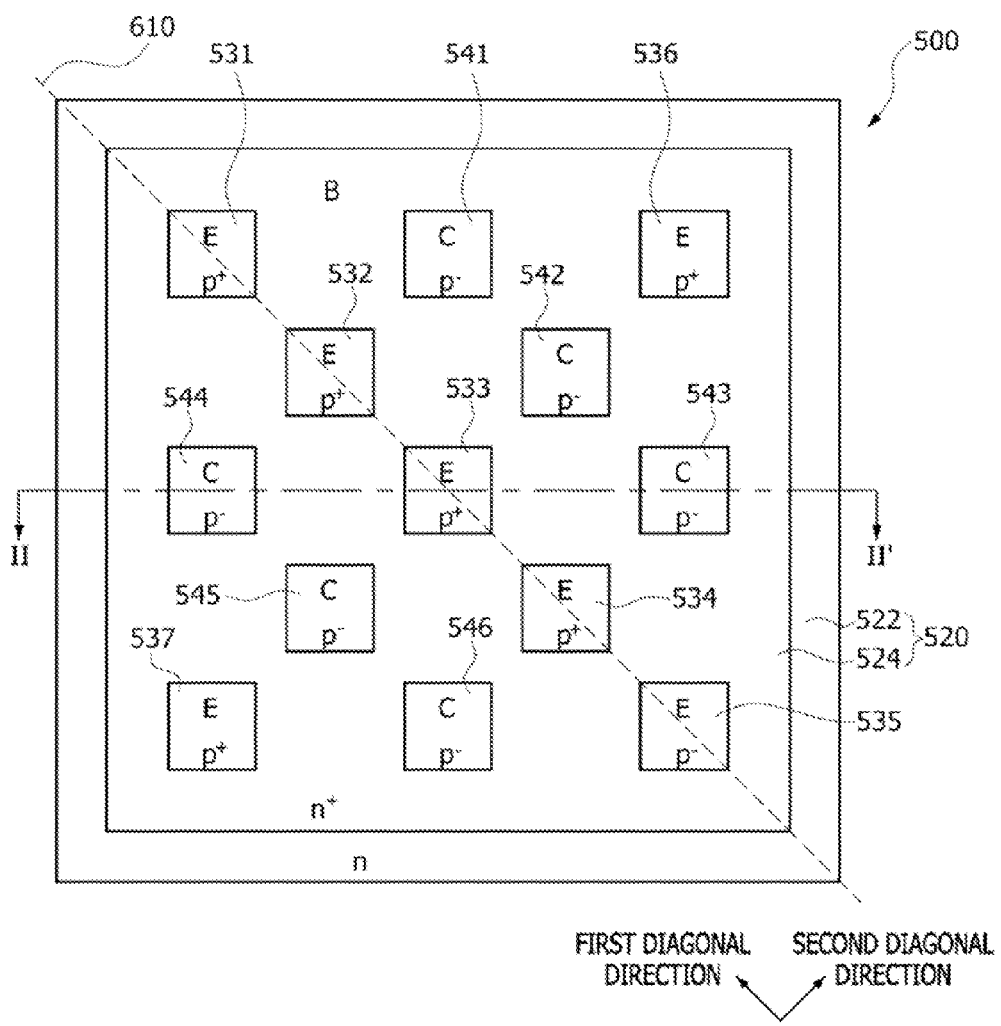
FIG. 6 is a plan view illustrating a lateral bipolar junction transistor according to another embodiment.

FIG. 6 is a plan view illustrating a lateral bipolar junction transistor 500 according to another embodiment. Referring to FIG. 6, the lateral bipolar junction transistor 500 may correspond to a lateral PNP bipolar junction transistor and may include a common base region 520, a plurality of island-shaped emitter regions 531~537 disposed in the common base region 520, and a plurality of island-shaped collector regions 541~546 disposed in the common base region 520. The common base region 520 may include a low concentration base region 522 and a high concentration base region 524. The low concentration base region 522 may be lightly doped with N-type impurities, and the high concentration base region 524 may be heavily doped with N-type impurities. The low concentration base region 522 may be disposed to surround sidewalls and a bottom surface of the high concentration base region 524. In some embodiments, the low concentration base region 522 may have a rectangular shape in a plan view. Similarly, the high concentration base region 524 may also have a rectangular shape in a plan view.

The plurality of island-shaped emitter regions 531~537 may be P-type, and the plurality of island-shaped collector regions 541~546 may also be P-type. An impurity concentration of the emitter regions 531~537 may be higher than an impurity concentration of the collector regions 541~546. The emitter regions 531~537 may include first emitter regions 531~535, a second emitter region 536, and a third emitter region 537. The first emitter regions 531~535 may be arrayed on a diagonal line 610, which extends from an upper-left corner of the high concentration base region 524 toward a lower-right corner of the high concentration base region 524 in a first diagonal direction, to be spaced apart from each other. The second emitter region 536 may be disposed in an upper-right corner of the high concentration base region 524, and the third emitter region 537 may be disposed in a lower-left corner of the high concentration base region 524. The collector regions 541~546 may include first collector regions 541~543 and second collector regions 544~546. The first collector regions 541~543 may be disposed between the diagonal line 610 and the second emitter region 536 and may be arrayed in the first diagonal direction to be spaced apart from each other. The second collector regions 544~546 may be disposed between the diagonal line 610 and the third emitter region 537 and may be arrayed in the first diagonal direction to be spaced apart from each other. According to the array of the emitter regions and the collector regions described above, the emitter regions and the collector regions may be alternately arrayed in a second diagonal direction perpendicular to the first diagonal direction.

Figure 7:
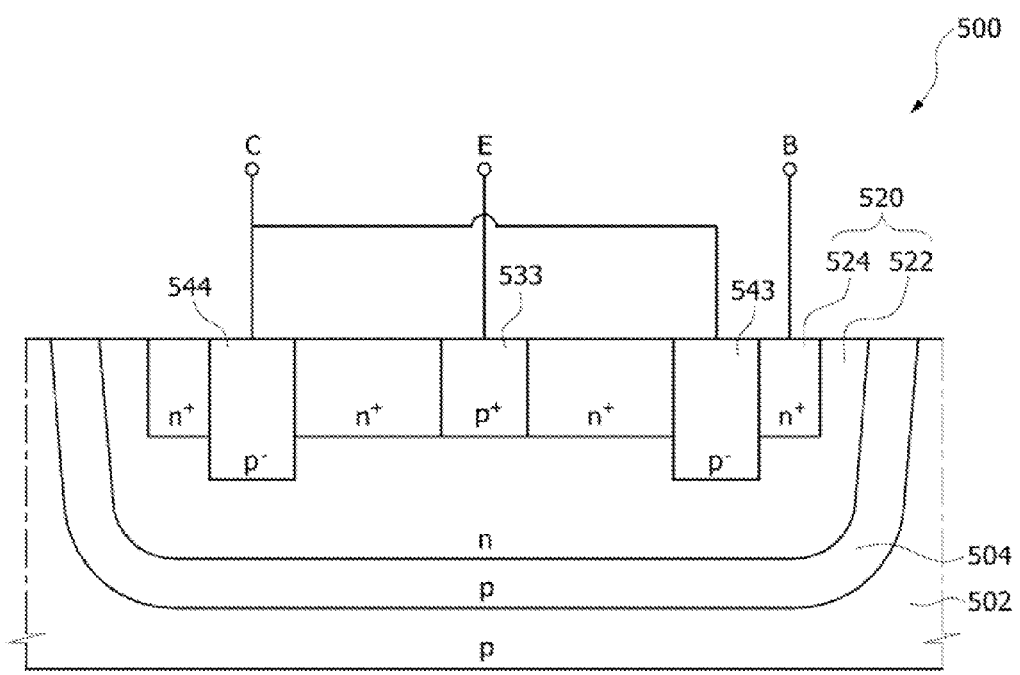
FIG. 7 is a cross-sectional view of the lateral bipolar junction transistor shown in FIG. 6 according to an embodiment, which is taken along a line II-II' of FIG. 6.

FIG. 7 is a cross-sectional view of the lateral bipolar junction transistor 500 shown in FIG. 6 according to an embodiment, which is taken along a line II-II' of FIG. 6. Although not shown in FIG. 6, a first P-type deep well region 504 may be disposed in an upper region of a P-type substrate 502. The first P-type deep well region 504 may be formed while P-type well region of other devices are formed in the substrate 502 adjacent to the lateral PNP bipolar junction transistor 500. Thus, if the other devices are formed without any P-type well region, the lateral PNP bipolar junction transistor 500 may be formed without the first P-type deep well region 504. The low concentration base region 522 of the common base region 520 may be disposed in an upper region of the first P-type deep well region 504. The emitter regions 531~537 and the collector regions 541~546 may be disposed in an upper region of the low concentration base region 522 to be spaced apart from each other. The high concentration base region 524 may be disposed between sidewalls of the emitter regions 531~537 and the collector regions 541~546.

The first emitter region 533 and the high concentration base region 524 may have the same junction depth. Although not shown in FIG. 7, all of the emitter regions 531~537 illustrated in FIG. 6 may have substantially the same junction depth as the high concentration base region 524. The first collector region 543 and the second collector region 544 may have a junction depth, which is greater than a junction depth of the high concentration base region 524. All of the collector regions 541~546 illustrated in FIG. 6 may also have substantially the same junction depth. The first collector region 543 and the second collector region 544 may be lightly doped with P-type impurities, as described above. Thus, all of the collector regions 541~546 may be formed while P-type lightly doped drain (LDD) regions (i.e., P-type extensions) of PMOS transistors are formed in other regions of the substrate 502 adjacent to the lateral bipolar junction transistor 500. The first emitter region 533 and the high concentration base region 524 may be heavily doped with P-type impurities and N-type impurities, respectively. Thus, the first emitter region 533 (i.e., all of the emitter regions 531~537) may be formed while P-type source/drain regions of the PMOS transistors are formed in the other regions of the substrate 502 adjacent to the lateral bipolar junction transistor 500, and the high concentration base region 524 may be formed while N-type body contact regions (or N-type source/drain regions) of the PMOS transistors (or NMOS transistors) are formed in the other regions of the substrate 502 adjacent to the lateral bipolar junction transistor 500. Accordingly, if the P-type LDD regions (i.e., the P-type extensions) of the PMOS transistors is deeper than the P-type source/drain regions and the N-type body contact regions of the PMOS transistors, the first collector region 543 and the second collector region 544 may be formed to be deeper than the high concentration base region 524 and the first emitter region 533, as illustrated in FIG. 7.

Since the first deep well region 504 and/or the substrate 502 is P-type and the low concentration base region 522 is N-type, a parasitic P-N diode may be provided between the substrate 502 and the low concentration base region 522. Thus, if a voltage applied to the first deep well region 504 and/or the substrate 502 is lower than a voltage applied to the low concentration base region 522, the parasitic P-N diode may be reverse-biased. Accordingly, the low concentration base region 522 may be electrically isolated from other devices disposed in the substrate 502 adjacent to the first deep well region 504, and an electric potential of the substrate 502 may not fluctuate even though the lateral bipolar junction transistor 500 operates.

The first emitter region 533 may be electrically connected to an emitter terminal E. Although FIG. 7 illustrates a cross-sectional view in which only the first emitter region 533 is electrically connected to the emitter terminal E, all of the emitter regions 531~537 illustrated in FIG. 6 may be electrically connected to the emitter terminal E. The first and second collector regions 543 and 544 may be electrically connected to a collector terminal C. More specifically, all of the collector regions 541~546 illustrated in FIG. 6 may be electrically connected to the collector terminal C. The high concentration base region 524 may be electrically connected to a base terminal B. Because both of the low concentration base region 522 and the high concentration base region 524 are N-type, a bias voltage may be transmitted from the base terminal B even to the low concentration base region 522 through the high concentration base region 524.

If a forward bias is applied between the emitter terminal E and the base terminal B and a reverse bias is applied between the collector terminal C and the base terminal B, the lateral bipolar junction transistor 500 may operate in an active mode. In the active mode of the lateral PNP bipolar junction transistor 500, holes corresponding to dominant carriers (or majority carriers) of current may move from the emitter terminal E toward the collector terminal C. Accordingly, collector current may flow from the emitter terminal E toward the collector terminal C.

Figure 8:
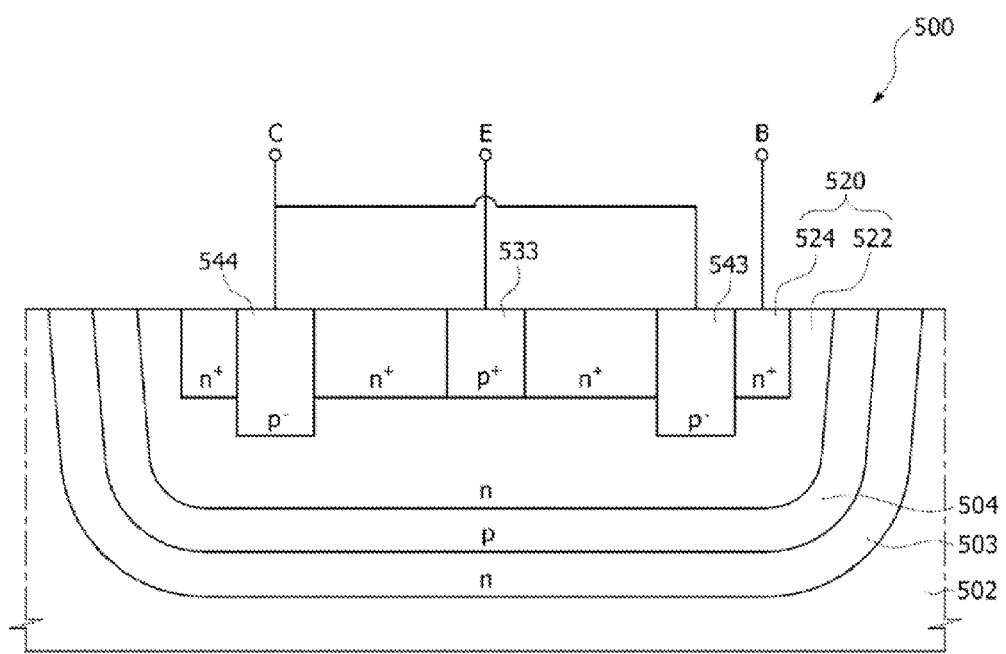
FIG. 8 is a cross-sectional view of the lateral bipolar junction transistor shown in FIG. 6 according to another embodiment, which is taken along the line II-II' of FIG. 6.

FIG. 8 is a cross-sectional view of the lateral bipolar junction transistor 500 shown in FIG. 6 according to another embodiment, which is taken along the line II-II' of FIG. 6. In FIG. 8, the same reference numerals as used in FIGS. 6 and 7 denote the same elements. Although not shown in FIG. 6, a first P-type deep well region 504 may be disposed in an upper region of a P-type substrate 502. Sidewalls and a bottom surface of the first P-type deep well region 504 may be surrounded by a second N-type deep well region 503 disposed in the substrate 502. That is, the second N-type deep well region 503 may be exposed at a top surface of the substrate 502, and the first P-type deep well region 504 may also be exposed at the top surface of the substrate 502. The low concentration base region 522 of the common base region 520 may be disposed in an upper region of the first P-type deep well region 504. The emitter regions 531~537 and the collector regions 541~546 may be disposed in an upper region of the low concentration base region 522 to be spaced apart from each other. The high concentration base region 524 of the common base region 520 may be disposed between sidewalls of the emitter regions 531~537 and the collector regions 541~546.

The first emitter region 533 and the high concentration base region 524 may have the same junction depth. Although not shown in FIG. 8, all of the emitter regions 531~537 illustrated in FIG. 6 may have substantially the same junction depth as the high concentration base region 524. The first collector region 543 and the second collector region 544 may have a junction depth which is greater than a junction depth of the high concentration base region 524. All of the collector regions 541~546 illustrated in FIG. 6 may also have substantially the same junction depth. The first collector region 543 and the second collector region 544 may be lightly doped with P-type impurities, as described above. Thus, all of the collector regions 541~546 may be formed while P-type lightly doped drain (LDD) regions (i.e., P-type extensions) of PMOS transistors are formed in other regions of the substrate 502 adjacent to the lateral bipolar junction transistor 500. The first emitter region 533 and the high concentration base region 524 may be heavily doped with P-type impurities and N-type impurities, respectively. Thus, the first emitter region 533 (i.e., all of the emitter regions 531~537) may be formed while P-type source/drain regions of the PMOS transistors are formed in the other regions of the substrate 502 adjacent to the lateral bipolar junction transistor 500, and the high concentration base region 524 may be formed while N-type body contact regions (or N-type source/drain regions) of the PMOS transistors (or NMOS transistors) are formed in the other regions of the substrate 502 adjacent to the lateral bipolar junction transistor 500. Accordingly, if the P-type LDD regions (i.e., the P-type extensions) of the PMOS transistors are deeper than the P-type source/drain regions and the N-type body contact regions of the PMOS transistors, the first collector region 543 and the second collector region 544 may be deeper than the high concentration base region 524 and the first emitter region 533, as illustrated in FIG. 8.

A first parasitic P-N diode may be provided between the first P-type deep well region 504 and the low concentration base region 522. In addition, a second parasitic P-N diode may be provided between the first P-type deep well region 504 and the second N-type deep well region 503. Thus, if a voltage applied to the low concentration base region 522 is higher than a voltage applied to the first deep well region 504, the first parasitic P-N diode may be reverse-biased to electrically isolate the low concentration base region 522 from the substrate 502. Moreover, if a voltage applied to the second deep well region 503 is higher than a voltage applied to the first deep well region 504, the second parasitic P-N diode may also be reverse-biased to electrically isolate the first deep well region 504 from the substrate 502. In either case, the low concentration base region 522 may be electrically isolated from other devices disposed in the substrate 502 adjacent to the first deep well region 504, and an electric potential of the substrate 502 may not fluctuate even though the lateral bipolar Junction transistor 500 operates.

The first emitter region 533 may be electrically connected to an emitter terminal E. Although FIG. 8 illustrates a cross-sectional view in which only the first emitter region 533 is electrically connected to the emitter terminal E, all of the emitter regions 531~537 illustrated in FIG. 6 may be electrically connected to the emitter terminal E. The first and second collector regions 543 and 544 may be electrically connected to a collector terminal C. More specifically, all of the collector regions 541~546 illustrated in FIG. 6 may be electrically connected to the collector terminal C. The high concentration base region 524 may be electrically connected to a base terminal B. Because both of the low concentration base region 522 and the high concentration base region 524 are N-type, a bias voltage may be transmitted from the base terminal B to the low concentration base region 522 through the high concentration base region 524. If a forward bias is applied between the emitter terminal E and the base terminal B and a reverse bias is applied between the collector terminal C and the base terminal B, the lateral bipolar junction transistor 500 may operate in an active mode. In the active mode of the lateral PNP bipolar junction transistor 500, holes corresponding to dominant carriers (or majority carriers) of current may move from the emitter terminal E toward the collector terminal C. Accordingly, collector current may flow from the emitter terminal E toward the collector terminal C.

Figure 9:
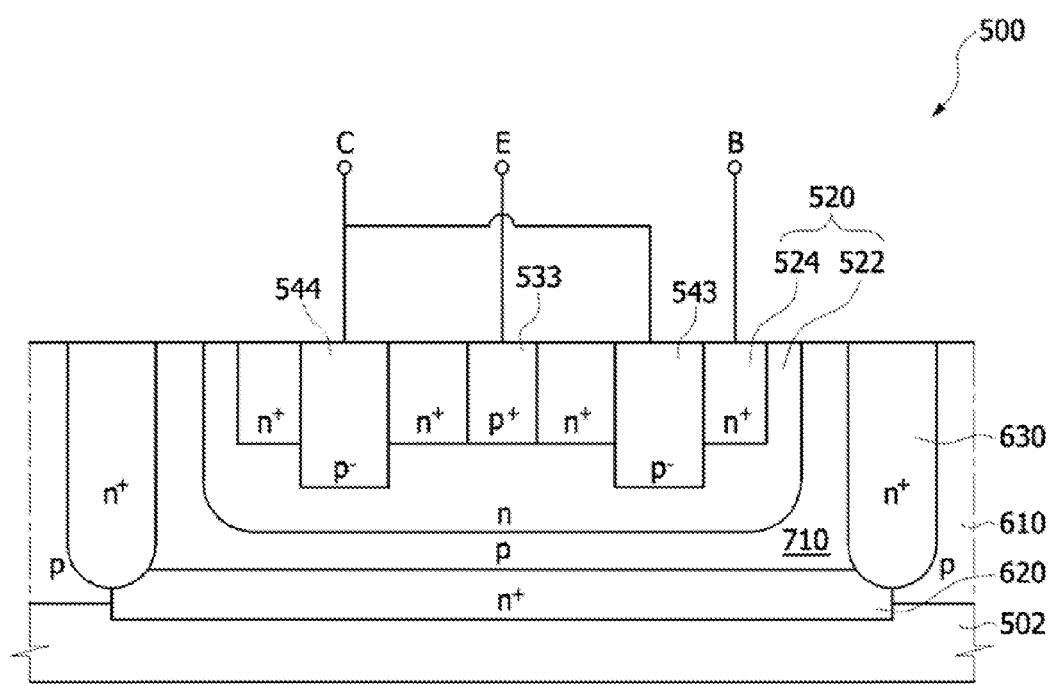
FIG. 9 is a cross-sectional view of the lateral bipolar junction transistor shown in FIG. 6 according to a further embodiment, which is taken along the line II-II' of FIG. 6.

FIG. 9 is a cross-sectional view of the lateral bipolar junction transistor 500 shown in FIG. 6 according to a further embodiment, which is taken along the line II-II' of FIG. 6. In FIG. 9, the reference numerals used denote the same elements of FIGS. 6, 7 and 8. Although not shown in FIG. 6, a P-type semiconductor layer 610 may be disposed in an upper region of a P-type substrate 502. The P-type semiconductor layer 610 may be formed using an epitaxial process. An N-type buried layer 620 may be disposed between the semiconductor layer 610 and the substrate 502. Impurities in the buried layer 620 may be activated and vertically diffused into the semiconductor layer 610 and the substrate 502 while the semiconductor layer 610 is formed. Edges of the buried layer 620 may be in contact with a lower end of an N-type sink region 630. The sink region 630 may upwardly extend to penetrate the semiconductor layer 610. Although not shown in FIG. 9, an N-type sink contact region may be disposed in an upper region of the sink region 630. The semiconductor layer 610 surrounded by the sink region 630 and the buried layer 620 may act as a P-type deep well region 710. The low concentration base region 522 may be disposed in an upper region of the deep well region 710. If a voltage applied to the sink region 630 and the buried layer 620 is higher than a voltage applied to the deep well region 710, the low concentration base region 522 may be electrically isolated from other devices disposed in the substrate 502 or the semiconductor layer 610, and an electric potential of the substrate 502 may not fluctuate even though the lateral bipolar junction transistor 500 fabricated in the low concentration base region 522 operates.

The first emitter region 533, the first collector region 543 and the second collector region 544 may be disposed in an upper region of the low concentration base region 522 to be spaced apart from each other. The high concentration base region 524 may be disposed between sidewalls of the first emitter region 533 and the first and second collector regions 543 and 544. The first emitter region 533 and the high concentration base region 524 may have the same junction depth. Although not shown in FIG. 9, all of the emitter regions 531~537 illustrated in FIG. 6 may have substantially the same junction depth as the high concentration base region 524. The first collector region 543 and the second collector region 544 may have a junction depth which is greater than a junction depth of the high concentration base region 524. All of the collector regions 541~546 illustrated in FIG. 6 may also have substantially the same junction depth.

The first emitter region 533 may be electrically connected to an emitter terminal E. Although FIG. 9 illustrates a cross-sectional view in which only the first emitter region 533 is electrically connected to the emitter terminal E, all of the emitter regions 531~537 illustrated in FIG. 6 may be electrically connected to the emitter terminal E. The first and second collector regions 543 and 544 may be electrically connected to a collector terminal C. More specifically, all of the collector regions 541~546 illustrated in FIG. 6 may be electrically connected to the collector terminal C. The high concentration base region 524 may be electrically connected to a base terminal B. Because both of the low concentration base region 522 and the high concentration base region 524 are P-type, a bias voltage may be transmitted from the base terminal B even to the low concentration base region 522 through the high concentration base region 524. If a forward bias is applied between the emitter terminal E and the base terminal B and a reverse bias is applied between the collector terminal C and the base terminal B, the lateral bipolar junction transistor 500 may operate in an active mode. In the active mode of the lateral PNP bipolar junction transistor 500, holes corresponding to dominant carriers (or majority carriers) of current may move from the emitter terminal E toward the collector terminal C. Accordingly, collector current may flow from the emitter terminal E toward the collector terminal C.

Figure 10:
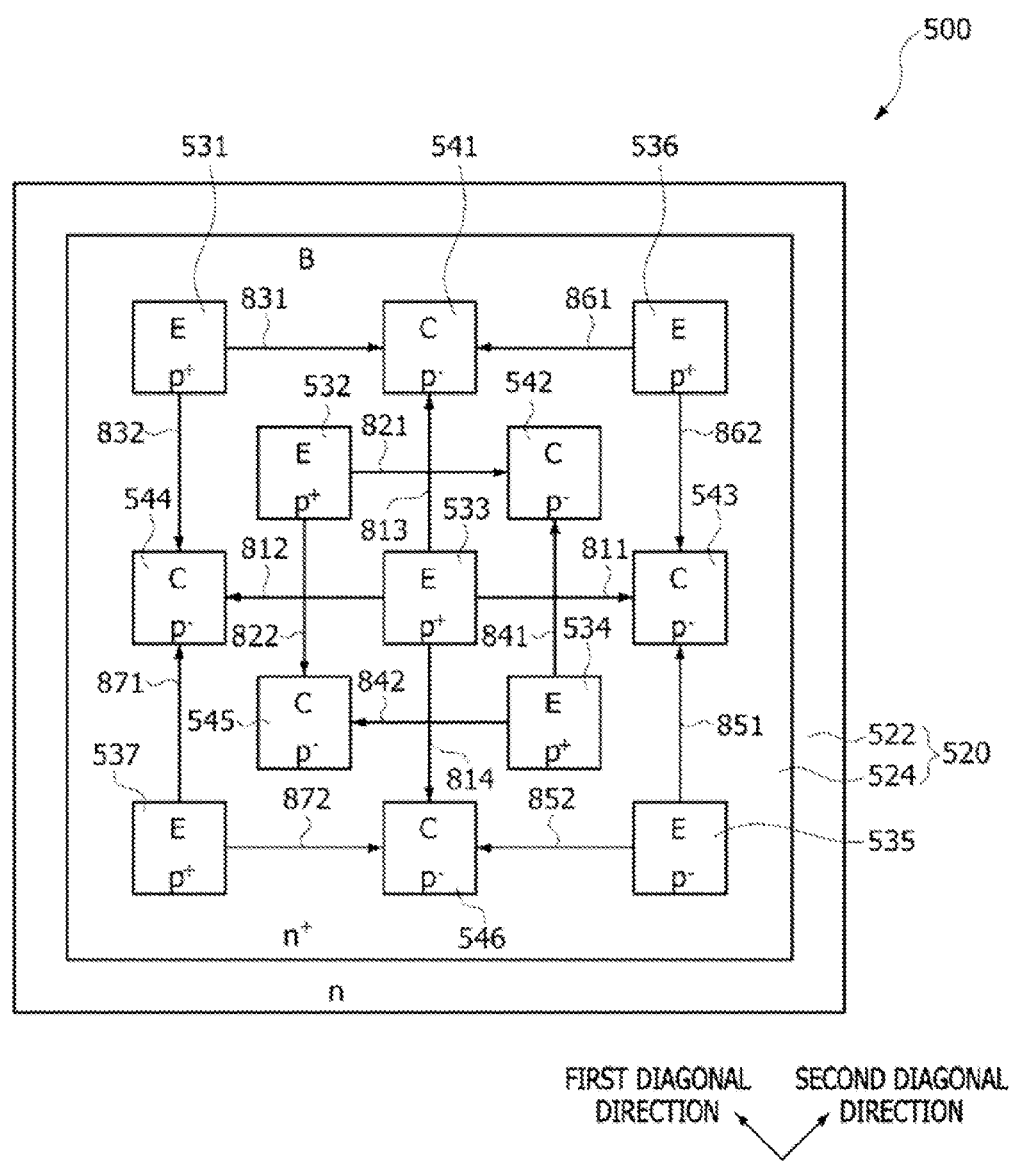
FIG. 10 is a plan view illustrating current paths between collector regions and emitter regions in an active mode of the lateral bipolar junction transistor shown in FIG. 6.

FIG. 10 is a plan view illustrating current paths between collector regions and emitter regions in an active mode of the lateral bipolar junction transistor 500 shown in FIG. 6. In FIG. 10, the same reference numerals as used in FIG. 6 denote the same elements. Thus, descriptions of the same elements as illustrated in FIG. 6 will be omitted or briefly mentioned in this embodiment.

Referring to FIG. 10, the first emitter region 533 disposed at a central region of the high concentration base region 524 may emit the carriers (e.g., holes) toward the first and second collector regions 543 and 544 through current paths 811 and 812, respectively. Furthermore, the first emitter region 533 may emit the carriers (e.g., holes) toward the first collector region 541 disposed at an upper side of the first emitter region 533 through a current path 813 and may emit the carriers (e.g., holes) toward the second collector region 546 disposed at a lower side of the first emitter region 533 through a current path 814. Thus, the current paths 811, 812, 813 and 814 may extend from four sidewalls of the first emitter region 533 toward the collector regions 543, 544, 541, and 546, respectively.

The first emitter region 532 may emit the carriers (e.g., holes) toward the first collector region 542 through a current path 821 and may emit the carriers (e.g., holes) toward the second collector region 545 through a current path 822. Thus, the current paths 821 and 822 may extend from a right sidewall and a lower sidewall of the first emitter region 532 toward the first and second collector regions 542 and 545, respectively. The first emitter region 531 may emit the carriers (e.g., holes) toward the first collector region 541 through a current path 831 and may emit the carriers (e.g., holes) toward the second collector region 544 through a current path 832. Thus, the current paths 831 and 832 may extend from a right sidewall and a lower sidewall of the first emitter region 531 toward the first and second collector regions 541 and 544, respectively.

The first emitter region 534 may emit the carriers (e.g., holes) toward the first collector region 542 through a current path 841 and may emit the carriers (e.g., holes) toward the second collector region 545 through a current path 842. Thus, the current paths 841 and 842 may extend from an upper sidewall and a left sidewall of the first emitter region 534 toward the first and second collector regions 542 and 545, respectively. The first emitter region 535 may emit the carriers (e.g., holes) toward the first collector region 543 through a current path 851 and may emit the carriers (e.g., holes) toward the second collector region 546 through a current path 852. Thus, the current paths 851 and 852 may extend from an upper sidewall and a left sidewall of the first emitter region 535 toward the first and second collector regions 543 and 546, respectively.

The second emitter region 536 may emit the carriers (e.g., holes) toward the first collector region 541 through a current path 861 and may emit the carriers (e.g., holes) toward the first collector region 543 through a current path 862. Thus, the current paths 861 and 862 may extend from a left sidewall and a lower sidewall of the second emitter region 536 toward the first collector regions 541 and 543, respectively. The third emitter region 537 may emit the carriers (e.g., holes) toward the second collector region 544 through a current path 871 and may emit the carriers (e.g., holes) toward the second collector region 546 through a current path 872. Thus, the current paths 871 and 872 may extend from an upper sidewall and a right sidewall of the third emitter region 537 toward the second collector regions 544 and 546, respectively.

As described above, the lateral bipolar junction transistor 500 may be configured to have sixteen current paths between the emitter terminal E (i.e., the emitter regions) and the collector terminal C (i.e., the collector regions). That is, the lateral bipolar junction transistor 500 may be designed to have sixteen current paths between the emitter terminal E (i.e., the emitter regions) and the collector terminal C (i.e., the collector regions) while the general bipolar junction transistor 10 shown in FIG. 1 has only four current paths 20 between the emitter terminal E (i.e., the emitter region 12) and the collector terminal C (i.e., the collector region 16), in the same planar area. Thus, the current-driving capability of the lateral bipolar junction transistor 500 may be improved as compared with the general bipolar junction transistor 10 shown in FIG. 1.

The embodiments of the present disclosure have been disclosed above for illustrative purposes. Those of ordinary skill in the art will appreciate that various modifications, additions, and substitutions are possible, without departing from the scope and spirit of the invention as disclosed in the accompanying claims.

What is claimed is:

1. A bipolar junction transistor comprising:
   a common base region;
   a plurality of emitter regions disposed in the common base region and arrayed to be spaced apart from each other in a first diagonal direction; and
   a plurality of collector regions disposed in the common base region and arrayed to be spaced apart from each other in the first diagonal direction,
   wherein the plurality of emitter regions and the plurality of collector regions are alternately arrayed in a second diagonal direction,
   wherein the common base region includes a high concentration base region disposed between sidewalls of the plurality of emitter regions and the plurality of collector regions, and a low concentration base region surrounding the high concentration base region, the plurality of emitter regions, and the plurality of collector regions, and
   wherein a first side of the high concentration base region is directly contacted to the collector region, and a second side of the high concentration base region is directly contacted to the emitter region.

2. The bipolar junction transistor of claim 1, wherein the common base region is disposed to surround sidewalls and bottom surfaces of the plurality of emitter regions and sidewalls and bottom surfaces of the plurality of collector regions.

3. The bipolar junction transistor of claim 1, wherein the high concentration base region and the low concentration base region are P-type, and the plurality of emitter regions and the plurality of collector regions are N-type.

4. The bipolar junction transistor of claim 3, further comprising:
   a deep well region surrounding sidewalls and a bottom surface of the low concentration base region and disposed in a substrate.

5. The bipolar junction transistor of claim 3, further comprising:
   a buried layer disposed under the low concentration base region; and
   a sink region disposed in contact with sidewalls of the low concentration base region and edges of the buried layer.

6. The bipolar junction transistor of claim 5, wherein the buried layer and the sink region are N-type.

7. The bipolar junction transistor of claim 6, wherein the low concentration base region is a portion of an epitaxial layer.

8. The bipolar junction transistor of claim 7, wherein the buried layer is disposed between the epitaxial layer and a substrate.

9. The bipolar junction transistor of claim 1, wherein the high concentration base region and the low concentration base region are N-type, and the plurality of emitter regions and the plurality of collector regions are P-type.

10. The bipolar junction transistor of claim 9, further comprising:
    a first deep well region surrounding sidewalls and a bottom surface of the low concentration base region and disposed in a substrate.

11. The bipolar junction transistor of claim 10, further comprising:
    a second deep well region disposed in the substrate and surrounding sidewalls and a bottom surface of the first deep well region.

12. The bipolar junction transistor of claim 10, further comprising:
    a buried layer disposed under the first deep well region; and
    a sink region disposed in contact with sidewalls of the first deep well region and edges of the buried layer.

13. The bipolar junction transistor of claim 12, wherein the buried layer and the sink region are N-type.

14. The bipolar junction transistor of claim 13, wherein the first deep well region is a portion of an epitaxial layer.

15. The bipolar junction transistor of claim 14, wherein the buried layer is disposed between the epitaxial layer and the substrate.

16. The bipolar junction transistor of claim 1, wherein the first and second diagonal directions are perpendicular to each other.

17. The bipolar junction transistor of claim 1, wherein the common base region has a rectangular shape in a plan view.

18. The bipolar junction transistor of claim 17, wherein the plurality of emitter regions includes:
    first emitter regions arrayed on a diagonal line which extends from an upper-left corner of the common base region toward a lower-right corner of the common base region;
    a second emitter region disposed in an upper-right corner of the common base region; and
    a third emitter region disposed in a lower-left corner of the common base region.

19. The bipolar junction transistor of claim 18, wherein the plurality of collector regions includes:
    first collector regions disposed between the diagonal line and the second emitter region and arrayed in the first diagonal direction; and second collector regions disposed between the diagonal line and the third emitter region and arrayed in the first diagonal direction.

\* \* \* \* \*